United States Patent [19]

Hodge

[11] 4,227,146
[45] Oct. 7, 1980

[54] CABLE TESTER FOR LOCATING SHORTS DISCONTINUITIES AND REVERSALS IN MULTI-CONDUCTOR CABLES

[76] Inventor: Stephen L. Hodge, 306 Thompson St., Richardson, Tex. 75080

[21] Appl. No.: 954,224

[22] Filed: Oct. 24, 1978

[51] Int. Cl.$^2$ ............................................. G01R 31/02
[52] U.S. Cl. ................................... 324/51; 324/73 R
[58] Field of Search .......................... 324/51, 66, 73 R

[56] References Cited

U.S. PATENT DOCUMENTS

| | | | |
|---|---|---|---|
| 2,912,648 | 11/1959 | Wales | 324/51 X |
| 3,480,856 | 11/1969 | Scott | 324/66 X |
| 3,528,104 | 9/1970 | Ehlschlager | 324/51 |
| 3,594,635 | 7/1971 | Minamii et al. | 324/51 |
| 3,600,673 | 8/1971 | Kohke | 324/51 |
| 3,728,616 | 4/1973 | Cheek et al. | 324/66 X |
| 3,986,106 | 10/1976 | Shuck et al. | 324/66 X |
| 4,042,878 | 8/1977 | Peterson et al. | 324/51 |
| 4,074,187 | 2/1978 | Miller et al. | 324/51 |

*Primary Examiner*—Gerard R. Strecker
*Attorney, Agent, or Firm*—Thomas L. Cantrell; Joseph H. Schley

[57] ABSTRACT

Disclosed is a cable tester for multi-conductor cables having a constant current power supply and circuitry for connecting the conductors of the cable in series with one another across the power supply simultaneously. The circuitry includes "open" detector lines, one connected in parallel with each cable conductor, and "short" detector lines, one connected in series with each conductor. The "open" detectors and "short" detectors have light sources in them, the "open" detector lights being normally off and the "short" detector lights being normally on. The "short" and "open" lights are arranged in an easily interpreted display. When only one end of a cable is accessible for testing, means are provided for connecting the cable conductors in selected pairs for testing by the test circuitry.

10 Claims, 7 Drawing Figures

CABLE TESTER FOR LOCATING SHORTS DISCONTINUITIES AND REVERSALS IN MULTI-CONDUCTOR CABLES

BACKGROUND OF THE INVENTION

Multi-conductor cables are widely employed in the tele-communications and data processing fields to connect different pieces of equipment in a system together, or to connect up different portions of a single piece of equipment. Typically a complete cable, or cable assembly, is made up of a length of multi-conductor cable with a multi-contact connector at each end for cooperation with mating multi-contact connectors on or in the equipment. Cable assemblies are constructed both in factories and at the point of use of the cable, and in either event must be tested to insure that no defects exist in the cable itself, in the connectors, or in the points of connection between conductors and connector contacts. The types of defects which must be found and corrected include breaks in a conductor or its contacts ("opens"), unwanted conduction paths between one conductor and another ("shorts"), and wiring of conductors to the incorrect contacts at one connector or another ("reversals"). Because of the structure of cable assemblies, and the fact that cables are typically flexed during installation (and sometimes during system usage also), shorts or opens sometimes appear only when the cable is in a certain position or configuration. These types of shorts or opens are particularly frustrating to locate, and are termed "intermittents".

Heretofore, it has been a common practice to test cable assemblies conductor-by-conductor, and to isolate defects by cumbersome and time consuming trouble-shooting methods.

SUMMARY OF THE INVENTION

In accordance with the present invention, a cable tester is provided which simultaneously tests all conductors in a multi-conductor cable assembly for opens, shorts, and reversals, and provides a visual display indicating the type of defect found, and its location (by conductor number). The apparatus of the invention is capable of testing cables both ends of which are accessible for connection to it at a single location, as in a factory environment. In accordance with another aspect of the invention, by the addition of further external elements to the circuitry and by variation of the interpretation of visual display, the apparatus is capable of testing a cable only one end of which accessible for connection to the testing apparatus, a situation commonly encountered in the field, where a cable may be strung through a wall or above a ceiling from one piece of equipment to another. In addition, means are preferably provided in the circuitry for detecting shorts from cable conductors to the metal shields commonly used on connectors and/or to earth ground.

The cable tester of the invention, in its preferred form, includes a power supply constructed to deliver a substantially constant current independent of the load placed across it. It further includes connector means for attaching the cable to be tested to the apparatus.

The apparatus of the invention also includes circuitry for organizing the conductors of the cable in series with one another across the output of the constant current power supply. This circuitry includes a set of "open" detector lines connected in parallel with the cable conductors, one such line being provided for each conductor. The "open" detector lines have light sources, such as light emitting diodes (LED's) in them, and have a substantially higher resistance than a cable conductor which has no "open" condition in it. Thus, when such a good conductor is connected in parallel with an "open" detector line, that detector line will be effectively shorted, and its light source will be off—"normally off." On the other hand, if the conductor has a partial or complete open in it, the primary conduction path will be through the detector line and the light source will be "on" or actuated. Actuation of the light source thus provides a visual indication that there is an "open" in that conductor.

The conductor organizing circuitry also includes a set of "short" detector lines, one for each conductor. Each "short" detector line is connected in series with the conductor with which it is associated, and with the next adjacent conductor. Each "short" detector line contains a light source. When the associated conductor is not shorted to another conductor, for instance the next adjacent conductor, there will be a current path through the "short" detector line and its light source will be on—"normally on". If, however, the associated conductor is shorted to the next adjacent conductor, the "short" detector line will be effectively shorted out of the circuit, and too small a current will flow through it to actuate its light source. Thus the normally on light will be off, and this provides a visual indication that the associated conductor is shorted to another conductor. In the circuit of the invention all of the "short" detector lines between the associated conductor and the conductor to which it is shorted will be off thus providing precise information concerning which conductors are shorted to each other.

In accordance with the preferred form of the invention, the normally off lights of the "open" detector lines and the normally on lights of the "short" detector lines are arranged in an overall display which is easy to read and in which "shorts" and "opens" are easily spotted. In particular, the display is arranged so that the "open" and "short" lights for a given conductor are in predetermined spaced relationship to each other and are preferably adjacent each other. The optimum display arrangement is one with the normally off lights aligned in a row or rows, and with the normally on lights aligned in parallel rows, and further with the two lights associated with a given conductor aligned on a line transverse to said rows.

From the foregoing, it can be seen that a principal object of the invention is the provision of a cable tester for a multi-conductor cable or cable assembly which tests all conductors simultaneously for shorts, opens, and reversals.

Another object of the invention is to provide a cable tester for a multi-conductor cable which requires connection to the cable being tested at only one end thereof.

A further object of the invention is the provision of a cable tester which is readily adapted to detect "intermittent" shorts and opens.

Still another object of the invention is the provision of a cable tester for a multi-conductor cable having a visual display arranged for easy interpretation of fault information.

The manner in which the foregoing objects and other objects of the invention are achieved may best be understood by a consideration of the detailed description which follows, together with the accompanying drawings.

DESCRIPTION OF THE DRAWINGS

FIG. 5 is a somewhat diagrammatic plan view of the display of the preferred embodiment, illustrating the light pattern when a cable with no faults is being tested;

FIG. 6 is a plan view similar to FIG. 5 showing a typical light pattern when a cable having faults is being tested.

DESCRIPTION OF THE PREFERRED EMBODIMENTS

Overall Configuration

Figure 1:
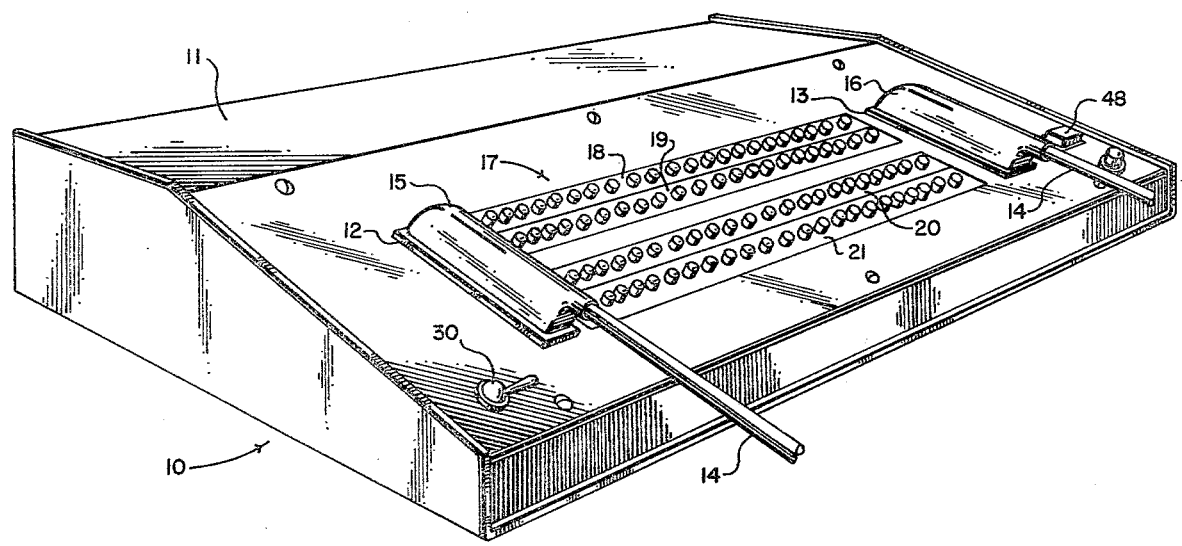
FIG. 1 is a perspective view of a cable tester constructed in accordance with the invention with both ends of a cable connected thereto for test.

Attention is first directed to FIG. 1, where the cable tester of the invention is designated generally as 10. It has a housing 11, of convenient but non-critical configuration. On the face of the housing are cable connector means 12 and 13. These are preferably standard 50-pin connectors of known type such as Amphenol 157 series one preferably being of male configuration and the other of female configuration. If it is desired to test cables of other than the very common 50-conductor variety, adapter plugs of appropriate configuration can be plugged into connector means 12 and 13, or alternately, connector means 12 and 13 may be altered.

FIG. 1 shows a cable 14 (partly broken out) with both ends thereof attached to the tester through connectors 15 and 16, which are plugged into connector means 13 and 14. This is the mode of hook-up employed when both ends of the cable are readily accessible to the tester, as would be the situation at an assembly table.

On the face of housing 11 there is located the display, designated generally as 17. In the preferred embodiment of FIG. 1, the display comprises four rows of fault indicator lights, row 18 containing the normally on or "short" detector lights for conductors 26 through 50 of a 50-conductor cable. Row 19 contains the normally off or "open" detector lights for conductors 26 through 50. Rows 18 and 19 are in parallel alignment, with the individual normally on and normally off lights for each given conductor aligned transversely to the rows. Thus the rows are horizontally oriented on housing 11, while the two lights for conductor number 30 are vertically aligned, for example.

Similarly, row 20 contains the normally on lights for conductors 25 through 1 of a 50-conductor cable, and row 21 contains the normally off lights for that group of conductors.

If it is desired to employ the cable tester to test a cable having fewer than 50 conductors, appropriate masks may be placed over those lights which are not needed. The preferred form of light is a light emitting diode, although other types of light sources may be substituted. If desired, the normally on lights may be colored green and the normally off lights colored red to assist the user in quickly reading and interpreting the display. Although they are omitted from FIGS. 1 and 2 for simplicity in illustration, it is preferred that the display include indicia in the manner shown in FIGS. 5 and 6 so that individual lights may readily be associated with the appropriate conductor.

Power Supply and Short-to-Shield-or-Ground Detector

Figure 3:
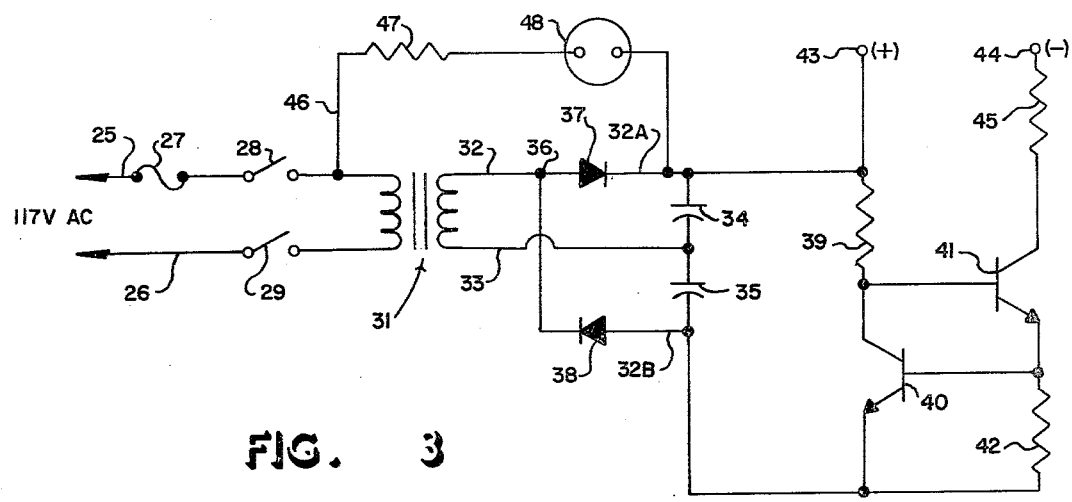
FIG. 3 is a schematic diagram of the power supply of the preferred embodiment.

As was pointed out above, a substantially constant current power supply is employed in the tester of the invention. The power supply of the preferred embodiment is shown in FIG. 3. 117 Volts A.C. power is delivered to the power supply circuit through lines 25, 26, line 25 containing a fuse 27. Lines 25, 26 contain arms 28, 29 of on-off switch 30 (see FIG. 1). From the switch arms, lines 25, 26 deliver power to the primary coil of isolation transformer 31.

Lines 32, 33 lead from the secondary of transformer 31. Line 33 terminates at the junction between capacitors 34 and 35. Line 32 branches at point 36 into lines 32A and 32B which are respectively connected to the non-common poles of capacitors 34 and 35. Lines 32A and 32B contain diodes 37 and 38 respectively, which diodes are oppositely oriented.

Line 32A is connected through resistor 39 to the collector of transistor 40 and the base of transistor 41. Line 32B is connected to the emitter of transistor 40, and, through resistor 42, to the emitter of transistor 41, and to the base of transistor 40.

Line 32A is connected to the power supply output terminal 43, and the collector of transistor 41 is connected to the other output terminal 44 through resistor 45.

The circuitry just described will, with appropriate component value selection, supply a direct current of approximately 20 ma to output terminals 43, 44 substantially independent of the size of the load placed across the terminals. It is preferred that transistors 40 and 41 be of the NPN type. Diodes 37 and 38 may be type IN4006.

The power supply has associated with it a special detector for indicating a short from any conductor in the cable being tested to a metallic connector housing and/or to earth ground. The special detector circuitry includes line 46 connected between line 25 and line 32A at a point between diode 37 and capacitor 34. Line 46 contains a sizable resistor 47, having a value for example of 100K, and a light source such as neon bulb 48 (See also FIG. 1). To test for a short from any cable conductor to a metalic connector housing, a ground clip is connected to the housing. If bulb 48 lights, the short exists. If bulb 48 lights without attachment of the ground clip, it indicates that a short from a conductor to earth ground exists. Either condition produces a current through line 46 great enough to illuminate bulb 48.

Cable Conductor Test Circuitry

Figure 4:
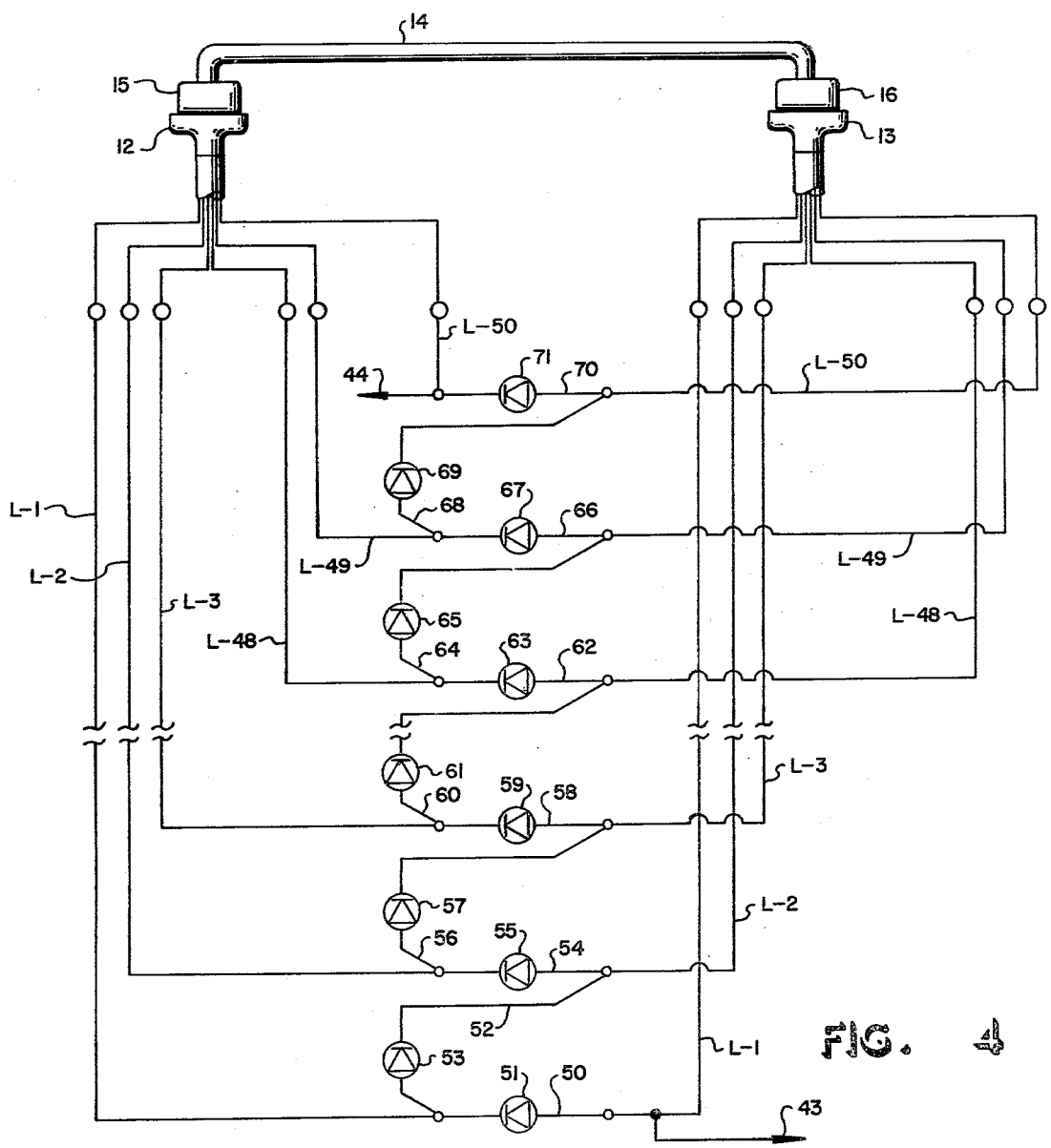
FIG. 4 is a schematic diagram of the test circuitry of the preferred embodiment, with part of the repetitive pattern of the circuitry broken out.

The main test circuitry is shown in FIG. 4, which repeats power supply terminals 43 and 44, and illustrates a test condition with both ends of a 50-conductor cable connected to the circuitry by connectors 12, 15 and 13, 16. Although the full circuitry includes "open" and "short" detector lines for 50 cable conductors, the circuitry for only six of these is shown in FIG. 4 for simplicity. The leads from connecting means 12 and 13 are labelled with the appropriate conductor number in FIG. 4, as L-1, L-2, L-3, and L-48, L-49, L-50.

Lead L-1, for conductor number 1 of the cable, is connected to one terminal of the power supply, terminal 43. Lead L-50, for conductor number 50 of the cable, is connected to the other terminal of the power supply, terminal 44. "Open" detector line 50 is connected in parallel, through lead L-1, with conductor number 1 in cable 14. Line 50 contains a light source, LED 51. The overall resistance of line 50 (including the light source) is substantially greater than that of cable conductor number 1, providing that conductor number 1 is sound and has no "opens". In this circumstances line 50 is effectively shorted by cable conductor number 1, and insufficient current flows through it to activate LED 51. LED 51 is thus normally OFF. On the other hand, if there is an "open" in cable conductor number 1, the main current path is through line 50, and LED 51 turns on, giving a visual indication of the presense of an "open" in cable conductor number 1.

Conductor number 1 is connected in series with conductor number 2 of the cable by "short" detector line 52, containing a light source, LED 53. If there is no short between conductors numbers 1 and 2 of the cable (or between conductor number 1 and any other conductor), the primary current path is through line 52, and LED 53 will be illuminated. Thus LED 53 is normally on. But if conductor number 1 is shorted to conductor number 2, for example, line 52 is effectively shorted, and insufficient current will pass through it to activate LED 53. This provides a visual indication of the presense of a short.

A consideration of FIG. 4 will reveal that conductor number 2 of the cable is similarly provided with an "open" detector line 54 with LED 55, and with a short detector line 56 with LED 57, and that this pattern of circuitry is provided for each cable conductor, the detector lines and LED's being numbered sequentially from the bottom of FIG. 4 to the top.

As is shown in FIG. 4, all of the conductors of the cable are connected in series with one another between power supply terminals 43 and 44, and each is provided with its own "open" detector and "short" detector in the manner described above in connection with conductor number 1. Current thus flows in series through the conductors and short detectors between terminals 43 and 44, except in those locations where an "open" exists in a conductor, in which case the current is shunted around that conductor through its "open" detector, as explained above. Also, if one conductor is shorted to another, the conductors and detectors, if any, lying between the shorted pair are effectively cut out of the current path between terminals 43 and 44.

Cable Testing with Both Cable Ends Connected to Tester

Figures 5, 6:
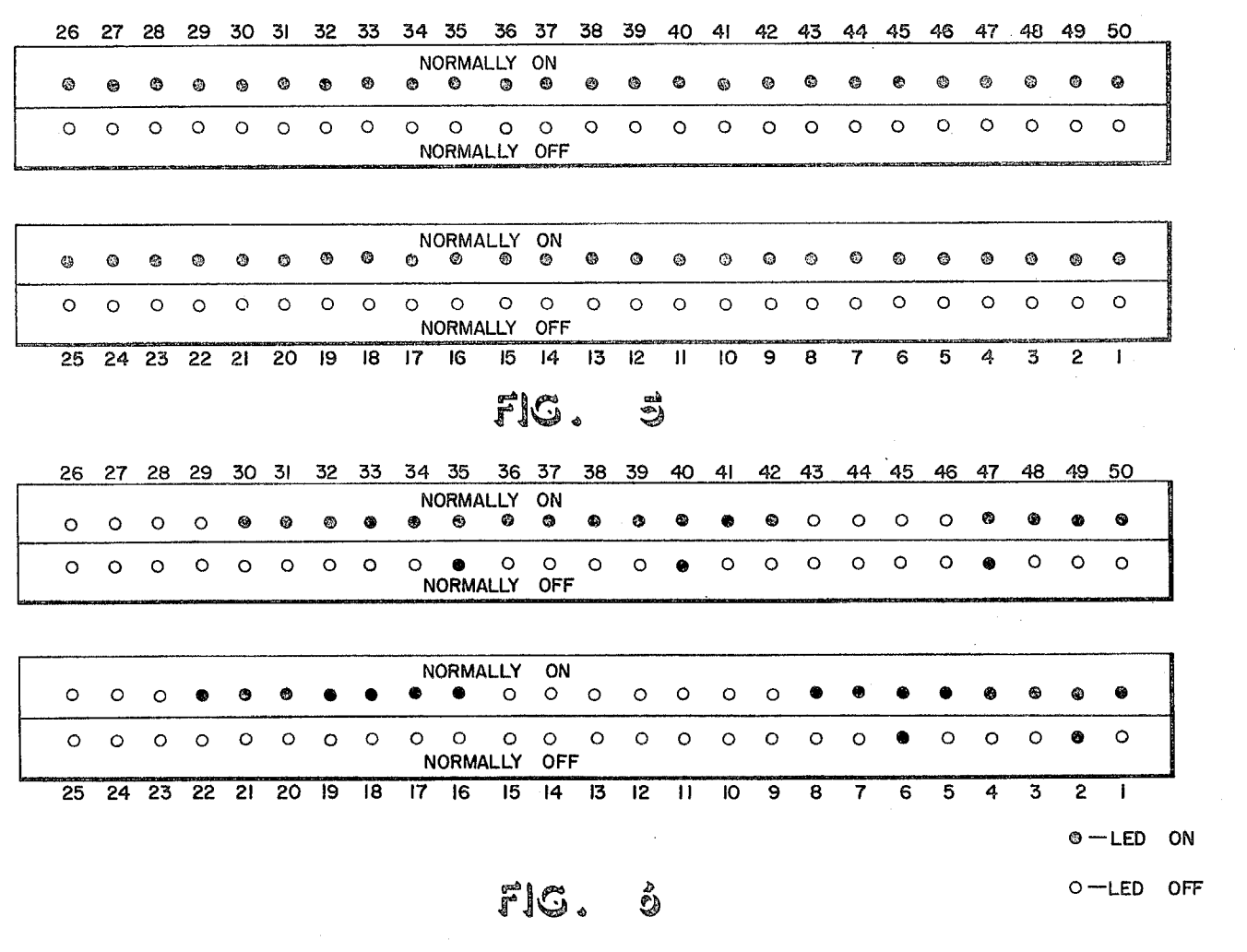

Attention is now directed to FIGS. 5 and 6, which show the display features of the invention as well as the indicia associated with the display in the preferred embodiment to make it easier to use. In these FIGS. the illumination of a light source is indicated by blackening in the circle; an unilluminated light source is indicated by an open circle.

The indicia include numbers to indicate the number of the conductor with which the vertically adjacent lights are associated, and the legends "normally on" and "normally off" to indicate the illumination condition of the adjacent rows of lights when a good cable is being tested.

A cable is tested for shorts, opens, and reversals by plugging the connectors at both of its ends into the connecting means and turning the power supply on at switch 30 (FIGS. 1 and 3). If the cable is free of defects, the display will appear as in FIG. 5. All of the lights in the "normally on" rows will be lighted, and all of the lights in the "normally off" rows will be off.

FIG. 6 illustrates the condition of the display when the cable being tested has faults in it. Note first that normally off lights for conductors 2, 6, 35, 40, and 47 are illuminated. This indicates that there are "opens" in these conductors. Next, note that normally on lights for conductors 9 through 15 are off. This means that conductor 9 is shorted to conductor 16 (or reversed with it), the display being read "from first off to first on" for the purpose of interpreting "short" signals. Similarly, conductor 23 is shorted to conductor 30, and conductor 43 is shorted to conductor 47. The remaining conductors in the cable have no defects.

Circuitry for Testing Cable from One End

Figure 2:
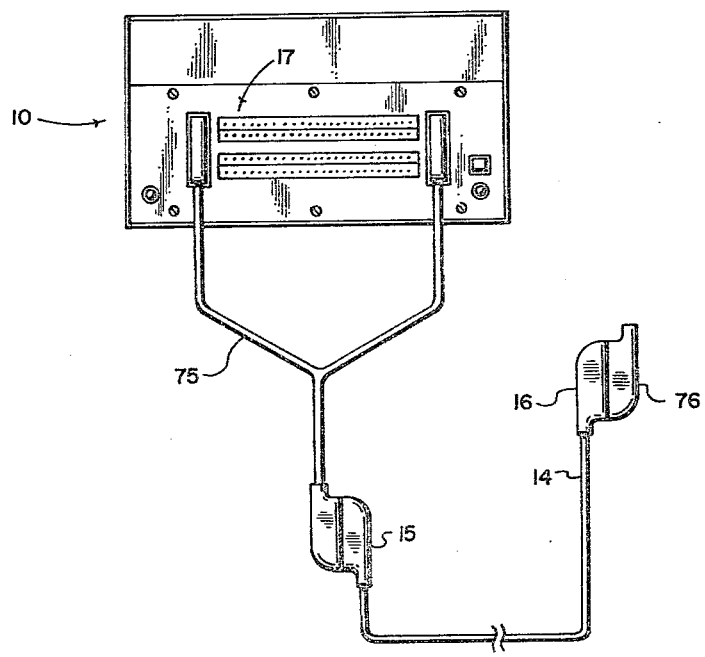
FIG. 2 is a diagrammatic plan view, on a reduced scale, of a cable tester of the invention with supplemental external circuitry adapting the tester to test cable with access to only one end thereof.

Attention is now directed to FIG. 2, which shows diagrammatically the supplemental circuitry required to give the cable tester as thus far described the capability of testing a cable when only one end of the cable is accessible to the tester.

Basically, the supplemental circuitry reorganizes the cable conductor circuitry temporarily for test purposes by connecting pairs of cable conductors together in series with each other to thereby reduce the number of conductors "seen" by the tester from 50 to 25, for example. Mechanically, this is accomplished by Y-cable 75, which connects one half of the conductors (number 1-25) to one tester connecting means 12, and the other half of the conductors (numbers 26-50) to the other tester connecting means 13, but at terminals 1 through 25 thereof.

In addition, blocks are provided for attachment to the connector of the cable at the end thereof remote from the tester (connector 16 in FIG. 2). Two such blocks are used, but since they are identical externally only one is illustrated in FIG. 2, where it is shown attached to connector 16 and is designated 76. The two blocks are employed in the testing sequentially, and as will be explained below, special rules for interpreting the display are used in each step of the sequence to obtain indications of the nature of the fault and its location. One block is conveniently termed a "short block", and is wired to connect cable connectors 1 and 50, 2 and 49, 3 and 48, etc., in series. The other block is termed an "open block" and is wired to connect cables 2 and 50, 3 and 49, 4 and 48, etc., in series. The blocks may be plugs or receptacles as a matter of connector structure, and ordinarily a tester will be equipped with short blocks of both types and open blocks of both types.

Test Procedure For Single End Testing and Display Interpretation

With the equipment organized as shown in FIG. 2, the test procedure and display interpretation is as follows, with reference to FIG. 7.

The short block is attached to the remote end of cable 14 first, and the Y-cable 75 is hooked up to the tester and near end of the cable as shown in FIG. 2.

With the equipment in this configuration, all "normally on" lights will be lit and all "normally off" lights on positions 1-25 of the display will be unlit.

If both lights are lit at any of display positions 1-25, an "open" exists in at least one of the two conductors being tested as a pair. Thus the display shown at the upper left of FIG. 7 indicates that an "open" exists in conductors 4, 47, or both 4 and 47.

In order to determine which of these conductors is "open", the short block is removed and replaced by the open block. When this is done, all lights in the normally off row for positions 1-25 will be lit, and the upper light on position 25 will also be lit. The fault tentatively located as involving conductors 4, 47 or both will now be reflected by one of three conditions, illustrated by the top right hand diagrams in FIG. 7. (1) If the normally on (upper) light for position 3 is lit, the "open" is in conductor number 4; (2) If the normally on light for position 4 is lit, the "open" is in conductor 47; or (3) If the normally on lights for both positions 4 and 3 are lit, both conductors 4 and 47 are "open".

If, when the short block is attached to the cable end, any of the normally on lights are not lit, a "short" or "reversal" exists in the cable. Two such situations are illustrated in the left middle and lower diagrams of FIG. 7. In the middle diagram the "reversal" or "short" involves conductors on the same side of the connector (i.e. among conductors 1-25 or among conductors 26-50). In the lower diagram, the "reversal" or "short" involves conductors on opposite sides of the connector. In both cases, the fault is among conductors 2, 4, 47 and 49.

In order to further isolate the location and character of the "short" or "reversal", the short block is removed. If, upon its removal any lights for the conductors involved are lit, the problem is a "short", not a "reversal". The location of the "short" is indicated by the pattern of lighted lights, as illustrated in the middle diagrams of FIG. 7. If the light pattern forms an angle away from vertical, the conductor involved is the one with the higher number. If the light pattern is vertical, the conductor involved is the one with the lower number.

Figure 7:
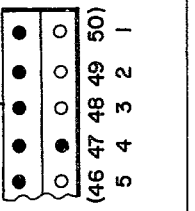
FIG. 7 is a chart illustrating the manner in which light patterns on the display are analysed and interpreted when a cable is being tested with access to only one end thereof.

If upon removal of the short block all lights for the conductor involved are unlit, the problem is a "reversal", as illustrated in the middle and bottom middle diagrams of FIG. 7, and the "reversal" possibilities are reduced to two in each case, which possibilities can then be checked out by standard trouble-shooting techniques.

When testing cables by either the technique of attaching one end to the tester or both ends to the tester, faults which are "intermittent" can be checked for by flexing the cable into different physical configurations to increase the opportunity for the fault to show up during the test.

I claim:

1. A cable tester for a multi-conductor cable comprising
   a substantially constant-current power supply;
   connector means for connecting at least one end of said cable to said tester;
   circuit means for connecting all of the conductors of said cable in series with one another to form a circuit across said power supply;
   said circuit means including a plurality of "open" detector lines, one connected in parallel with each cable conductor, each of said "open" detector lines having a substantially higher resistance than the cable conductor with which it is connected in parallel, each of said "open" detector lines having therein a light source activatable upon the occurrence of an "open" in its associated cable conductor;
   said circuit means further including a plurality of "short" detector lines, one connected in series between each cable conductor and the next adjacent cable conductor each of said "short" detector lines having therein a light source activatable in the absence of a "short" in its associated cable conductor; and
   said "open" detector light sources and said "short" detector light sources being arranged in a display in a seclected pattern with both of the light sources associated with a given cable conductor in predetermined spaced relationship to each other.

2. A cable tester in accordance with claim 1 in which said selected display pattern of "open" and "short" detector light sources comprises:
   at least one row comprising a plurality of "open" detector light sources; and
   at least another row comprising a plurality of "short" detector light sources aligned parallel to and extending coextensive with said row of "open" detector light sources, the "open" and "short" light sources associated with a given cable wire being aligned with each other transverse to said rows.

3. A cable tester in accordance with claim 2 in which said "open" detector light sources are arranged in two rows and said "short" detector light sources are arranged in two rows.

4. A cable tester in accordance with claim 1 in which said light sources are light emitting diodes.

5. A cable tester in accordance with claim 1 in which the light sources for said "open" detectors are of a color different than the light sources for said "short" detectors.

6. A cable tester in accordance with claim 1 and further comprising connector means for connecting both ends of said cable to the tester.

7. A cable tester in accordance with claim 1 in which said power supply includes a jumper line at least partially thereacross, said jumper line having a selected resistance and having a light source therein actuatable upon the passage of a selected current therethrough.

8. A cable tester in accordance with claim 1 and further comprising
   block means for connecting the conductors of said cables in selected series pairs with one another at a cable end remote from said tester so that access to only a single end of said cable by said tester is required;
   and means for connecting said series pairs to said tester.

9. A cable tester in accordance with claim 8 in which said block means comprises means for alternately connecting series pairs of conductors in a first selected pattern and in a second selected pattern by conductor number, said second selected pattern being displaced from said first selected pattern by one conductor number.

10. A cable tester for a multi-conductor cable comprising:
    a substantially constant-current power supply;
    connector means for connecting at least one end of said cable to said tester;

circuit means for connecting all of the conductors of said cable in series with one another to form a circuit across said power supply;

said circuit means including a plurality of "open" detector lines, one connected in parallel with each cable conductor, each of said "open" detector lines having a substantially higher resistance than the cable conductor with which it is connected in parallel, each of said "open" detector lines having therein a light source activatable upon the occurrence of an "open" in its associated cable conductor;

said circuit means further including a plurality of "short" detector lines, one connected in series between each cable conductor and the next adjacent cable conductor each of said "short" detector lines having therein a light source activatable in the absence of a "short" in its associated cable conductor; and said "open" detector light sources and said "short" detector light sources being arranged in a display in a selected pattern which comprises:

at least one row comprising a plurality of "open" detector light sources; and at least another row comprising a plurality of "short" detector light sources aligned parallel to and extending coextensive with said row of "open" detector light sources, and "open" and "short" light sources associated with a given cable wire being aligned with each other transverse to said rows;

said power supply including a jumper line at least partially thereacross, said jumper line having a selected resistance and having a light source therein actuatable upon the passage of a selected current therethrough;

block means for connecting the conductors of said cables in selected series pairs with one another at a cable end remote from said tester so that access to only a single end of said cable by said tester is required;

said block means further comprising means for alternately connecting series pairs of conductors in a first selected pattern and in a second selected pattern by conductor number, said second selected pattern being displaced from said first selected pattern by one conductor number; and means for connecting said series pairs to said tester.

* * * * *